United States Patent [19]

Simpson

[11] 4,004,190
[45] Jan. 18, 1977

[54] ELECTRICAL AMPLIFIERS
[75] Inventor: Bryan John Simpson, Selmeston near Polegate, England
[73] Assignee: U.S. Philips Corporation, New York, N.Y.
[22] Filed: May 7, 1975
[21] Appl. No.: 575,127
[30] Foreign Application Priority Data
  May 13, 1974  United Kingdom ............ 20989/74
[52] U.S. Cl. .......................... 315/403; 307/235 K; 315/389; 315/408; 315/410; 328/147
[51] Int. Cl.² ........................................ H01J 29/70
[58] Field of Search .......... 315/387, 388, 389, 403, 315/408, 409, 410; 328/147; 307/235 K

[56] References Cited
UNITED STATES PATENTS

| | | | |
|---|---|---|---|
| 3,508,158 | 4/1970 | Marchese | 328/147 |
| 3,715,621 | 2/1973 | Schiess | 315/389 |
| 3,842,311 | 10/1974 | Knox | 315/388 |
| 3,906,305 | 9/1975 | Nillesen | 315/410 |
| 3,914,654 | 10/1975 | Cooksey | 315/408 |

Primary Examiner—Maynard R. Wilbur
Assistant Examiner—S. C. Buczinski
Attorney, Agent, or Firm—Frank R. Trifari; Henry I. Steckler

[57] ABSTRACT

An amplifier circuit for amplifying a repetitive alternating signal, the amplifier circuit having a voltage feedback loop which includes a sampling circuit. The sampling circuit is arranged to sample the output voltage of the amplifier at a given time during each cycle of the alternating signal and to store the sampled voltage for the remainder of the cycle. This stored voltage is used as a feedback signal for the amplifier. Since the output is sampled at the same time during each cycle of the alternating signal the filter circuit in the feedback loop may be omitted and the phase shift introduced by the feedback loop may be arranged to be constant with varying frequencies. When used in a field deflection circuit for television display apparatus the deflection waveform is preferably sampled during the flyback period.

9 Claims, 6 Drawing Figures

ELECTRICAL AMPLIFIERS

The invention relates to amplifiers in which feedback from an output to an input is employed. A particular application of the invention is in field timebase circuits for television display apparatus employing current and voltage feedback.

A known field deflection circuit having an output amplifier stage employing d.c. voltage feedback in conjunction with current feedback is shown in block diagrammatic form in FIG. 1 of the accompanying drawings. The voltage feedback loop is introduced to fix the mean output voltage at a given level, for example half the supply voltage, with varying component tolerance spreads in the amplifier. This circuit has a non-inverting input terminal 1 through which the deflection signal is applied to an input of an amplifier 2. The output of the amplifier 2 is applied to a deflection coil L1 which is arranged in series with a capacitor C1 and resistor R1. The junction of deflection coil L1 and capacitor C1 is connected via a resistor R2 to an input of the amplifier 2, while the junction of capacitor C2 and resistor R1 is connected to an inverting input of amplifier 2 via a capacitor C2. FIG. 2 shows the voltage gain of the amplifier plotted against frequency with varying feedback arrangements. If the feedback circuit is broken at point S then the voltage gain/frequency characteristic will be as shown by curve A. This characteristic arises because the current feedback causes the output current of the amplifier 2 to be constant while the reactance of capacitor 1 increases with decreasing frequency, so that the open loop gain is reached at zero frequency (or d.c.). This means that any low frequency disturbance at the input of the amplifier 2 is greatly magnified at its output.

With the circuit completed at S the gain at zero and very low frequencies is reduced to a low value but the amplifier and feedback network as a whole has sufficient phase shift and gain to produce oscillation at certain frequencies, about 3hz in a typical case. The gain/frequency characteristic of the stage is now as shown by curve B. The magnitude of the peak gain at around 3 hz is extremely dependent on circuit parameters and tolerances and if a step waveform is applied to the input a ringing waveform is produced at the output. This causes a noticable variation in vertical position of the picture on a television display tube. If the feedback loops are broken in this circuit, and the frequency and phase characteristic measured, it is found that the open loop gain /phase characteristic misses the point of oscillation ($\beta M = 1$ $\theta = 0°$) by a small angular safety margin. Because this safety margin is small, a step waveform applied to the input of the amplifier causes damped oscillation to occur and the output rings.

It is an object of the invention to provide an amplifier circuit having an alternative feedback circuit.

The invention provides an amplifier for amplifying an alternating signal including feedback means for feeding a signal proportional to an output voltage from the amplifier to an input thereof, the feedback means comprising means for sampling the output voltage during a given time during each cycle of the alternating signal, means for producing a feedback signal proportional to the sampled voltage, the feedback signal remaining substantially constant during the remainder of each cycle of the alternating signal, and means for applying the feedback signal to the input. The sampled voltage may be stored as the charge on a capacitor.

Preferably the feedback means introduces a substantially constant phase shift with varying input frequencies.

The invention further provides a field deflection circuit for television display apparatus including such an amplifier.

The invention still further provides a field deflection circuit for television display apparatus comprising means for feeding a deflection waveform to a first input of an amplifier circuit, the output of the amplifier being connected to a deflection coil, first feedback means for feeding a signal proportional to the current through the deflection coil to a second control input of the amplifier, and second feedback means for feeding a signal proportional to the integrated output voltage of the amplifier to a third control input of the amplifier; the second feedback means comprising means for sampling the voltage at a given time during each cycle of the deflection waveform, and means for producing a feedback signal proportional to the sampled voltage, the feedback signal remaining substantially constant during the remainder of each cycle of the deflection waveform. The second feedback means may introduce a substantially constant phase shift with varying input frequencies and the given time is within the flyback period.

The sampled voltage may be stored as the charge on a capacitor. The capacitor may be adapted to be charged through a circuit including a first transistor and discharged through a circuit including a second transistor. The first and second transistors may be controlled to cause the capacitor to be charged or discharged only during the given time.

A flyback pulse applied to or generated within the amplifier may be effective to cause the supply voltage to at least part of the amplifier to be increased during the flyback period.

The amplifier may include a differential amplifier the second control input of the amplifier being coupled to a first input of the differential amplifier and the first input of the amplifier being coupled to a second input of the differential amplifier. The first and second inputs of the differential amplifier having an inverting relationship with respect to each other, the arrangement being such that, when the first input of the amplifier is fed with a sawtooth waveform, a sawtooth waveform with a flyback pulse superimposed thereon is produced at the output of the differential amplifier.

The invention yet further provides television display apparatus including such a field deflection circuit.

An embodiment of the invention will now be described, by way of example, with reference to the accompanying drawings, in which.

Figure 3:
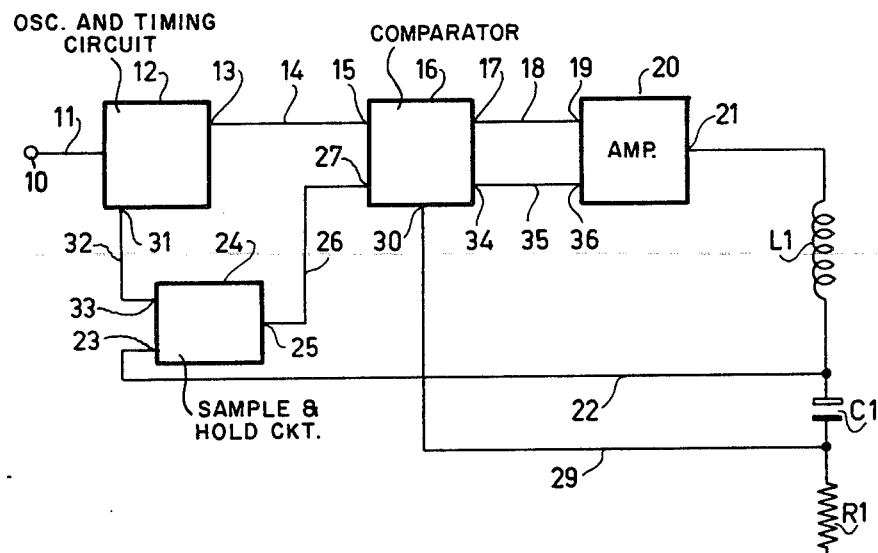
FIG. 3 shows a field deflection circuit for television display apparatus incorporating the invention.

The field deflection circuit shown in FIG. 3 has an input terminal 10 connected via a line 11 to an oscillator and timing circuit 12. An output 13 of the oscillator 12 is connected via line 14 to an input 15 of a comparator circuit 16. An output 17 of the comparator circuit 16 is connected via a line 18 to the input 19 of an amplifier 20 whose output 21 is connected to the series arrangement of a deflection coil L1, capacitor C1 and resistor R1. The junction of deflection coil L1 and capacitor C1 is connected via a line 22 to an input 23 of a sample and hold circuit 24. The output 25 of the sample and hold circuit 24 is connected to an input 27 of the comparator circuit 16 via a line 26. The junction of capacitor C1 and resistor R1 is connected via a line 29 to an input 30 of the comparator circuit 16. The other end of resistor R1 is connected to a.c. earth. An output 31 of the oscillator circuit 12 is connected via a line 32 to an input 33 of the sample and hold circuit 24.

Figure 1:
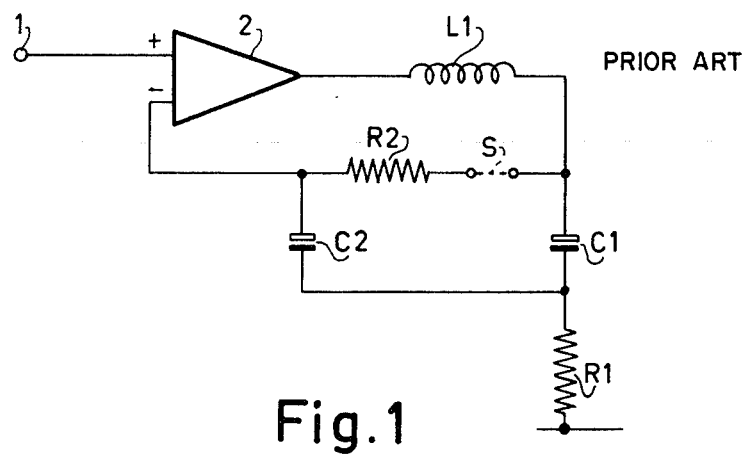
FIG. 1 shows the prior art circuit.
Figure 2:
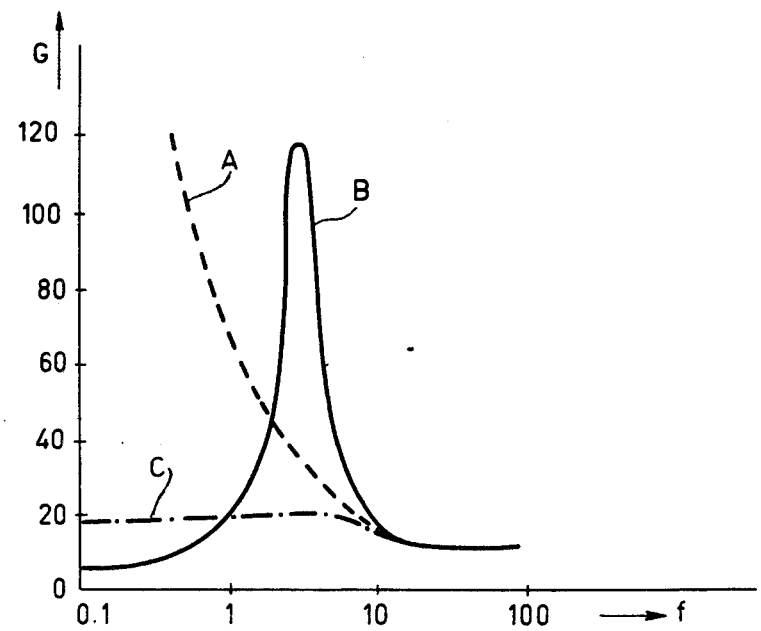
FIG. 2 is a graph of grain verses frequency for both the prior art circuit and that of the invention.

In operation synchronising pulses are applied at terminal 10 to control the output frequency of the oscillator circuit 12. The oscillator produces a sawtooth waveform having a frequency of 50 hz when designed for television display apparatus operating at a scanning rate of 50 fields per second. The sawtooth waveform which will normally have correction waveforms superimposed thereon e.g. for pin cushion and convergence corrections is applied to input 15 of the comparator circuits 16 and the output 17 of the comparator circuit is applied to the input 19 of amplifier 20. The comparator 16 and amplifier 20 together form an amplifier whose overall gain is controlled by current and voltage feedback. Current negative feedback is applied from the junction of capacitor C1 and resistor R1 to the input 30 of the comparator 16. The interaction of the sawtooth waveform from the oscillator 12 and the current feedback signal applied at input 30 within the comparator may be used to produce a flyback pulse in which the duration is automatically corrected for variations in supply voltage and picture height. The signal from output 34 of the comparator circuit fed to the input 36 of amplifier 20 controls a section within the amplifier which increases the effective supply voltage to the output transistors of the amplifier during the flyback period. The sample and hold circuit 24 is fed with flyback pulses from the oscillator 12 at input 33 and is further fed at input 23 with the negative feedback signal from the junction of deflection coil L1 and capacitor C1. The sample and hole circuit 24 samples the voltage at the junction of the coil L1 and capacitor C1, which voltage is proportional to the output from the amplifier 20, during the flyback period under the control of flyback pulses generated in the oscillator 12 and stores this sampled voltage to produce a substantially constant output voltage for the remainder of each cycle of the input waveform. The waveform at this point has a parabolic form and is superimposed on a d.c. component. This waveform is produced at the junction of the deflection coil L1 and capacitor C1 from the sawtooth voltage waveform at the output of the amplifier as the combination of the deflection coil L1 and capacitor C1 acts as an integrating circuit at field frequencies. At field frequencies the deflection coil L1 is resistive rather then inductive. By sampling the voltage during the flyback period only the d.c. component is used to control the gain of the amplifier and there is no requirement for an R.C. and L.C. filter in the feedback loop to smooth out a ripple voltage. Since there are no reactive components in the feedback loop there is no frequency dependent phase shift and the stage does not approach an oscillatory condition at low frequencies. The gain frequency characteristic becomes substantially that shown by curve C in FIG. 2 of the accompanying drawings.

Figure 4:
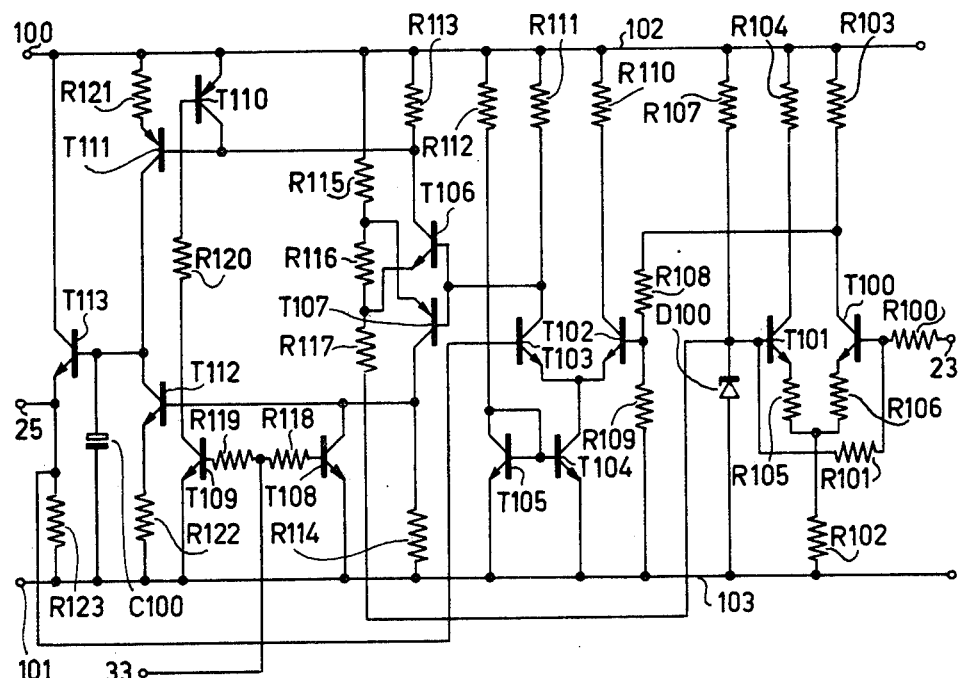
FIG. 4 shows the circuit diagram of a sample and hold circuit for use in the field deflection circuit shown in FIG. 3.

FIG. 4 is a circuit diagram of a sample and hold circuit suitable for use in the circuit arrangement of FIG. 3. An input terminal 23 is connected via a resistor R100 to the junction of the base of an n-p-n transistor T100 and a resistor R101 whose other end is connected to the junction of the base of an n-p-n transistor T101, a resistor R107 whose other end is connected to a positive supply rail 102, a resistor R117 and via a voltage reference diode D100 to the negative supply rail 103. The emitter of transistor T100 is connected to one end of a resistor R106 the other end of which is connected to the junction of a resistor R102 whose other end is connected to a negative supply rail 103 and a resistor R105 whose other end is connected to the emitter T101. The collectors of transistors T100 and T101 are connected to the positive supply rail 102 via resistors 103 and 104 respectively. A resistor R108 is connected between the junction of the collector of transistor T100 and resistor R103 and the junction of the base of an n-p-n transistor T102 and a resistor R109 whose other end is connected to the negative supply rail 103. The emitter of transistor T102 is connected to the emitter of an n-p-n transistor T103 and the collector of an n-p-n transistor T104, whose emitter is connected to the negative supply rail 103.

The collectors of transistors T102 and T103 are connected to the positive supply rail 102 via resistors R110 and R111 respectively. The base of transistor T104 is connected to the base of and collector of an n-p-n transistor T105, whose emitter is connected to the negative supply rail 102, and to one end of a resistor R112 the other end of which is connected to the positive supply rail 103. The collector of transistor T103 is connected to the base of an n-p-n transistor T106 and to the base of a p-n-p transistor T107. The collector of transistor T106 is connected to one end of a resistor R113 whose other end is connected to the positive supply rail 102, the collector of a p-n-p transistor 110 whose emitter is connected to the positive supply rail 102, and the base of p-n-p transistor T111, the emitter of which is connected to the positive supply rail via a resistor R121. The collector of transistor T107 is connected to one end of a resistor R114 whose other end is connected to the negative supply rail 103, the collector of an n-p-n transistor T108 whose emitter is connected to the negative supply rail 103, and the base of an n-p-n transistor T112 whose emitter is connected to the negative supply rail 103 via a resistor R122. The other end of resistor R117 is connected to the junction of the emitter of transistor T106 and a resistor R116 whose other end is connected to the junction of the emitter of transistor T107 and a resistor R115 the other end of which is connected to the positive supply rail 102. A terminal 33 is connected to the base of transistor T108 via a resistor R118 and to the base of an n-p-n transistor T109 via a resistor R119. The collector of transistor T109 is connected to the base of transistor T110 via a resistor R120 while its emitter is connected to the negative supply rail 103. The collector of transistor T112 is connected to the collector of transistor T111, the positive plate of a capacitor C110, whose negative plate is connected to the negative supply rail 103, and to the base of an n-p-n transistor T113. The emitter of transistor T113 is connected to a terminal 25, one end of a resistor R123 whose other end is connected to the negative supply rail 103 and a terminal 101, and to the base of transistor T103. The collector of transistor T113 is connected to the positive supply rail 102 and a terminal 100.

In operation the signal from the junction of the deflection coil L1 and capacitor C1, which is of parabolic waveform superimposed on a d.c. component, is fed to terminal 23. Flyback pulses from the oscillator and timing circuit 12 are applied to terminal 33 and an output is taken from terminal 25. The input signal fed to terminal 23 is applied to the base of transistor T100 which transistor together with transistor T101 forms a buffer amplifier in which the input signal is inverted. The output from this buffer amplifier is taken from the collector of transistor T100 and applied to the base of transistor T102 via resistor R108. Transistor T102 together with transistor T103 forms a comparator circuit. The output terminal 25 is connected to the base of transistor T103 and thus the comparator circuit compares the input signal voltage with the outut signal voltage. The output from the comparator is taken from the collector of transistor T103 and is applied to the bases of transistors T106 and T107. If the signal at the base of transistor T102 is greater than that at the base of transistor T103 then transistor T106 conducts and, provided the signal at terminal 33 allows, transistor T111 conducts to charge capacitor C100. If the signal at the base of transistor T103 is greater than that at the base of transistor T102 then transistor T107 conducts and, provided the signal at terminal 33 allows, the transistor T112 conducts to discharge capacitor C100. The voltage on capacitor C100 is applied to the output terminal 25 through an emitter follower circuit formed by transistor T113 and resistor R123.

The signal applied to terminal 33 is fed to the bases of transistors T108 and T109. If the signal applied to terminal 33 is positive with respect to the negative supply rail transistors T108 and T109 are turned on and hence transistor T110 is also turned on. This causes transistors T111 and T112 to be turned off regardless of the state of the outputs from transistors T106 and T107. If the signal applied to terminal 33 is at or more negative than the negative supply voltage then transistors T108, T109 and T110 will all be turned off and transistors T111 and T112 controlled by transistors T106 and T107. When used in a field deflection circuit the input 33 is fed with field flyback pulses or pulses during the field flyback period which pulses may be of narrower width than the flyback pulse so that the waveform appearing at input 23 is effectively sampled during the flyback period only, i.e. when its parabolic component is zero. This means that no smoothing circuit is required to suppress the parabolic component and hence the phase shift produced by a smoothing circuit is absent. When this circuit is used in the feedback loop of the amplifier as described the gain/frequency characteristic is substantially as shown by curve C of FIG. 2. It should, however, be noted that if there is significant resistance in the paths between transistors T111 and T112 and the capacitor C100 the voltage gain/frequency characteristic is degraded and may approach that shown by curve B of FIG. 2. Capacitor C100 should be charged (or discharged) by transistor T111 (or T112) during the flyback period at a very much greater rate than the rate at which charge leaks away from the capacitor during the scan period.

Figure 5:
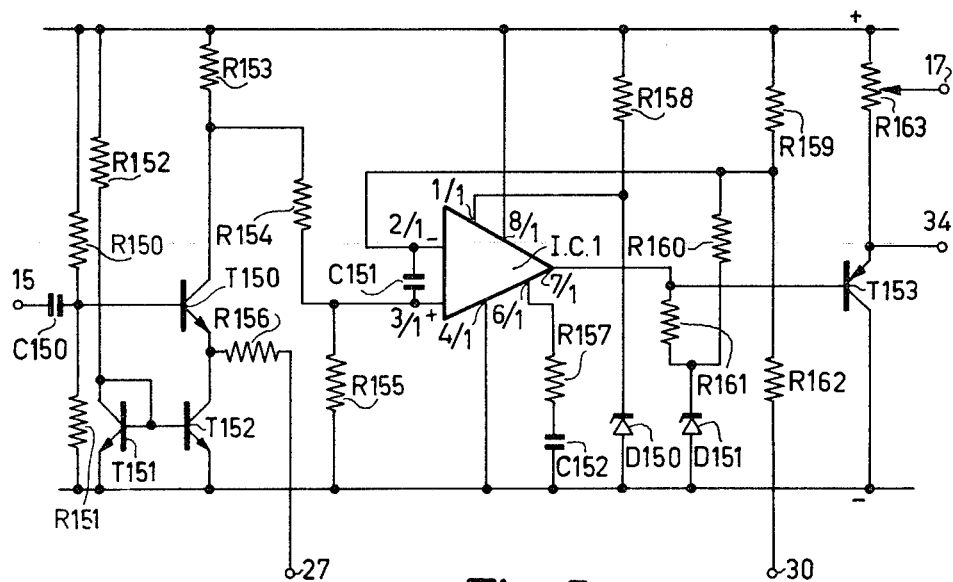
FIG. 5 shows the circuit diagram of a comparator circuit for use in the field deflection circuit shown in FIG. 3.

FIG. 5 shows a comparator circuit suitable for use as the comparator 16 in the arrangement shown in FIG. 3. The input and output terminals of this comparator/circuit have been given the same reference numerals as the circuit 16 in FIG. 3. Terminal 15 is connected via a capacitor C150 to the junction of a resistor R150 whose other end is connected to the positive supply rail, a resistor R151 whose other end is connected to the negative supply rail, and the base of an n-p-n transistor T150. The emitter of transistor T150 is connected to the junction of the collector of an n-n-n transistor T152 an a resistor R156 whose other end is connected to terminal 27. The collector of transistor T150 is connected to the junction of a resistor R153 whose other end is connected to the positive supply rail and a resistor R154 whose other end is connected, to the junction of a resistor R155 whose other end is connected to the negative supply rail, a capacitor C151, and to a positive or non-inverting input terminal 3/1 of an integrated operational amplifier I.C.1. The base of transistor T152 is connected to the junction of the base and collector of an n-p-n transistor T151 and a resistor T152 whose other end is connected to the positive supply rail. The emitters of transistors T151 and T152 are both connected to the negative supply rail. A negative or inverting terminal 2/1 of operational ampllifier I.C.1 is connected to the junction of a resistor R159 whose other end is connected to the positive supply rail, a resistor R162 whose other end is connected to terminal 30, and a resistor R160 whose other end is connected to the junction of a voltage reference diode D151 and a resistor R161. Terminal 7/1 of amplifier I.C.1 is connected to the junction of the base of p-n-p transistor T153 and resistor R161. Terminal 6/1 of amplifier I.C.1 is connected to one end of a resistor R157 whose other end is connected to the negative supply rail via a capacitor C152. Terminal 1/1 of amplifier I.C.1. is connected to the junction of voltage reference diode D150 and a resistor R158 whose other end is connected to the positive supply rail. Terminals 8/1 and 4/1 of amplifier I.C.1. are connected to the positive and negative supply rails respectively. Capacitor C151 is connected between terminals 2/1 and 3/1 of the amplifier I.C.1. The emitter of transistor T153 is connected to terminal 34 and to one end of a potentiometer R163 whose other end is connected to the positive supply rail while the collector of transistor T153 is connected to the negative supply rail. The wiper of potentiometer R163 is connected to terminal 17.

In operation a substantially sawtooth waveform is applied to terminal 15 and thence to the base of transistor T150. The output from the sample and hold circuit is fed to terminal 27 thus setting the emitter potential and hence the d.c. working point of T150. The effect of changes in potential at terminal 27 is to vary the bias setting of transistor T150 and the signal at the collector retains the same peak to peak value, regardless of changes in potential at terminal 27, but is superimposed on a varying d.c. offset potential. The collector of transistor T150 is connected to the non inverting input 3/1 of amplifier I.C.1. The signal from the junction of capacitor C1 and resistor R1 (FIG. 3) is fed to terminal 30 and is then coupled to the inverting input 2/1 of amplifier I.C.1. The application of the two signals to the inputs 2/1 and 3/1 of the amplifier I.C.1.

causes the output 7/1 of the amplifier I.C.1. to produce a sawtooth waveform with a flyback pulse superimposed thereon. This signal is applied to a buffer amplifier including transistor T153 and a first output taken from terminal 34 while a second variable output adjusted by potentiometer R163 is taken from terminal 17.

Figure 6:
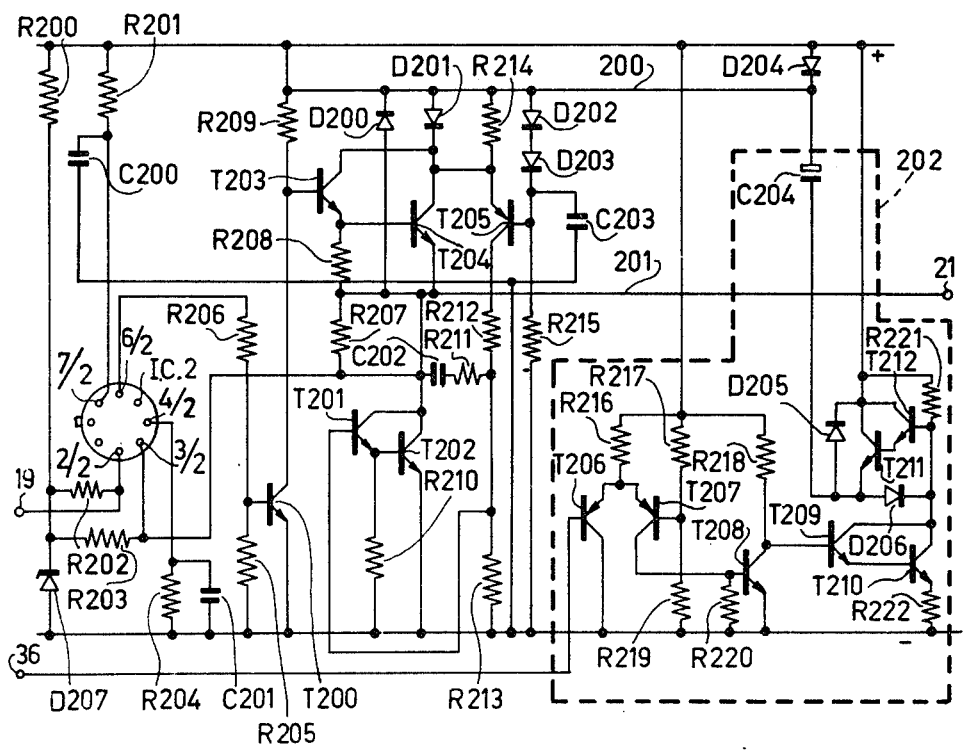
FIG. 6 shows the circuit diagram of an output amplifier for use in the field deflection circuit shown in FIG. 3.

FIG. 6 shows an amplifier circuit suitable for use as the amplifier 20 shown in FIG. 3. Input and output terminals have been given the same reference numerals as those shown in FIG. 3. The amplifier has an input terminal 19 which is connected to an input terminal 2/2 of an integrated operational amplifier I.C.2. and to one end of a resistor R202 whose other end is connected to the junction of a resistor R200 whose other end is connected to the positive supply rail and a voltage reference diode D207 whose other end is connected to the negative supply rail. A resistor R201 is connected between the positive supply rail and on the junction of a capacitor C200 whose other terminal is connected to the negative supply rail and a terminal 7/2 of amplifier I.C.2. The parallel combination of a resistor R204 and a capacitor C201 is connected between the negative supply rail and a terminal 4/2 of the amplifier I.C.2. Terminal 6/2 of the amplifier I.C.2 is connected via the series arrangement of a resistor R206 and a resistor R205 to the negative supply rail. The junction of resistors R205 and R206 is connected to the base of an n.p-n. transistor T200 whose emitter is connected to the negative supply rail. The collector of transistor T200 is connected to the junction of a resistor R209 whose other end is connected to a line 200 and the base of an n.p.n. transistor T203. The emitter of transistor T203 is connected to the base of an n.p.n transistor T204 and via the series arrangement of a resistor R208, a resistor R207, and a resistor R203 to voltage reference diode D207. The collector of transistor T203 is connected to line 200 via the parallel combination of a diode D201 and a resistor R214 and to the collector of transistor T204 and the emitter of a p.n.p. transistor T205. The junction of resistors R208 and R207 is connected via a line 201 to terminal 21 while the junction of resistors R207 and R203 is connected to terminal 3/2 of amplifier I.C.2. A diode D200 is connected between lines 200 and 201. The collector of transistor T205 is connected to the negative supply through the series arrangement of a resistor R212 and a resistor R213. The junction of resistors R212 and R213 is connected to a resistor R211 whose other end is connected to a capacitor C202 and to the base of an n.p.n. transistor T201, the emitter of which is connected to the base of an n.p.n. transistor T202 and via a resistor R210 to the negative supply rail the emitter of transistor T202 also being connected to the negative supply rail. The collectors of transistors T201 and T202 are commoned and connected to the other end of capacitor C202 and to line 201 and the emitter of transistor T204. The series arrangement of two diodes D202 and D203 and a resistor R215 is connected between line 200 and the negative supply rail, the junction of diode D203 and resistor R215 being connected to the base of transistor T205 and to one end of a capacitor C203 whose other end is connected to the negative supply rail. Terminal 36 is connected to the base of a p.n.p. transistor T206 whose collector is connected to the negative supply rail. The emitter of transistor T206 is connected to the emitter of p.n.p. transistor T207 and via a resistor R216 to the positive supply rail. The series arrangement of a resistor R217 and a resistor R219 is connected between the positive and negative supply rails, the junction of resistors R217 and R218 being connected to the base of transistor T207. The collector of transistor T207 is connected to the base of an n.p.n. transistor T208 and via a resistor R220 to the negative supply rail. The collector of transistor T208 is connected to the base of an n.p.n. transistor T209 and via a resistor R218 to the positive supply rail while its emitter is connected to the negative supply rail. The emiter of transistor T209 is connected to the base of an n.p.n. transistor T210 while its collector is connected to the collector of transistor T210. The collector of transistor T210 is further connected to the cathode of a diode D206, the base of an n.p.n. transistor T212, and one end of a resistor R221 whose other end is connected to the positive supply rail. The anode of diode D206 is connected to the anode of a diode D205 whose cathode is connected to the positive supply rail, to the emitter of transistor T211, and to the negative electrode of an electrolytic capacitor C204. The positive electrode of capacitor C204 is connected to the cathode of diode D204 whose anode is connected to the positive supply rail. The junction of capacitor C204 and diode D204 is connected to line 200. The emitter of transistor T210 is connected to the negative supply rail via a resistor R222. The collectors of transistors T211 and T212 are commoned and connected to the positive supply rail while the emitters of transistor T212 is connected to the base of transistor T211.

In operation the deflection waveform (sawtooth plus flyback) is applied to terminal 19. This signal is derived from terminal 17 of the comparator circuit and is then amplified in amplifier I.C.2. and the output from terminal 6/2 of amplifier I.C.2. fed to the base of transistor T200. The output from the collector of transistor T200 controls the conductivity of output transistor pair T203 and T204 and via transistor T205 the conductivity of output transistor pair T201 and T202 and hence the amplitude of the signal at terminal 21. During the flyback period the signal applied to terminal 36, i.e. that produced at terminal 34 of the comparator, causes the circuitry within the dotted area 202 to increase the potential on line 200 i.e. the supply voltage to the output transistors T201 to T204. This is achieved by adding the potential across capacitor C204 to the potential on the positive supply rail.

What is claimed is:

1. A field deflection circuit for television display apparatus having a deflection coil, said circuit comprising main amplifier means having a first input means for receiving a deflection waveform signal, second and third control input means, and an output means for coupling to said deflection coil, a first negative feedback means for feeding a signal proportional to the current through said deflection coil for said second control input of said amplifier, and said second negative feedback means for feeding a signal proportional at a given time to the output voltage of said amplifier to said third control input of said amplifier; said second feedback means comprising means for sampling said voltage at said given time during each cycle of said deflection waveform, and means for producing a feedback signal proportional to said sampled voltage, said feedback signal remaining substantially constant during the remainder of each cycle of said deflection waveform.

2. A field deflection circuit as claimed in claim 1, wherein said second feedback means introduces a substantially constant phase shift with varying input frequencies.

3. A field deflection circuit as claimed in claim 1, wherein said given time is within the flyback period.

4. A field deflection circuit as claimed in claim 1, further comprising a capacitor means for storing said sampled voltage.

5. A field deflection circuit as claimed in claim 4, further comprising a first transistor means for charging said capacitor and a second transistor means for discharging said capacitor.

6. A field deflection circuit as claimed in claim 5, further comprising means for controlling said first and second transistors to cause said capacitor to be charged or discharged only during said given time.

7. A field deflection circuit as claimed in claim 1, further comprising means for causing the supply voltage to at least part of said amplifier to be increased during the flyback period in accordance with a flyback pulse.

8. A field deflection circuit as claimed in claim 1, wherein said main amplifier includes a differential amplifier, said second control input of said main amplifier being coupled to a first input of said differential amplifier and said first input of said main amplifier being coupled to a second input of said differential amplifier, said first and second inputs of said differential amplifier having an inverting relationship with respect to each other, a sawtooth waveform with a flyback pulse superimposed thereon being produced at the output of said differential amplifier when a sawtooth waveform is applied to said main amplifier first input.

9. Television display apparatus including a field deflection circuit as claimed in claim 1.

* * * * *